(12) United States Patent
Wang et al.

(10) Patent No.: US 12,230,567 B2
(45) Date of Patent: Feb. 18, 2025

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Wei-Ren Wang, New Taipei (TW); Tze-Liang Lee, Hsinchu (TW); Jen-Hung Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 691 days.

(21) Appl. No.: 17/461,166

(22) Filed: Aug. 30, 2021

(65) Prior Publication Data

US 2023/0068625 A1  Mar. 2, 2023

(51) Int. Cl.
*H01L 23/522* (2006.01)
*H01L 21/311* (2006.01)
*H01L 21/768* (2006.01)

(52) U.S. Cl.
CPC .... *H01L 23/5226* (2013.01); *H01L 21/31144* (2013.01); *H01L 21/76826* (2013.01); *H01L 21/76832* (2013.01); *H01L 21/76877* (2013.01)

(58) Field of Classification Search
CPC .......... H01L 23/5226; H01L 21/76826; H01L 21/76832; H01L 21/76877; H01L 21/76849; H01L 21/76834; H01L 21/76883; H01L 21/76897; H01L 21/76829

See application file for complete search history.

(56) References Cited

U.S. PATENT DOCUMENTS 10,629,484 B1 * 4/2020 Parikh ............... H01L 21/76868
2020/0135557 A1 * 4/2020 Huang ............... H01L 21/76856

* cited by examiner

*Primary Examiner* — Syed I Gheyas
(74) *Attorney, Agent, or Firm* — Birch, Stewart, Kolasch & Birch, LLP

(57) ABSTRACT

A semiconductor structure includes a first dielectric layer, a first conductive feature, a second conductive feature, a first etch stop layer, and a conductive via. The first conductive feature and the second conductive feature are embedded in the first dielectric layer. The first etch stop layer is disposed over the dielectric layer. The conductive via is surrounded by the first etch stop layer and electrically connected to the first conductive feature, in which the conductive via is in contact with a top surface of the first etch stop layer.

20 Claims, 20 Drawing Sheets

SEMICONDUCTOR STRUCTURE AND MANUFACTURING METHOD THEREOF

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

Semiconductor structures are typically formed using multiple layers of material, including conductive and insulating layers. To provide electrical conductivity between layers in a semiconductor structure, a via/contact may be formed through certain layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
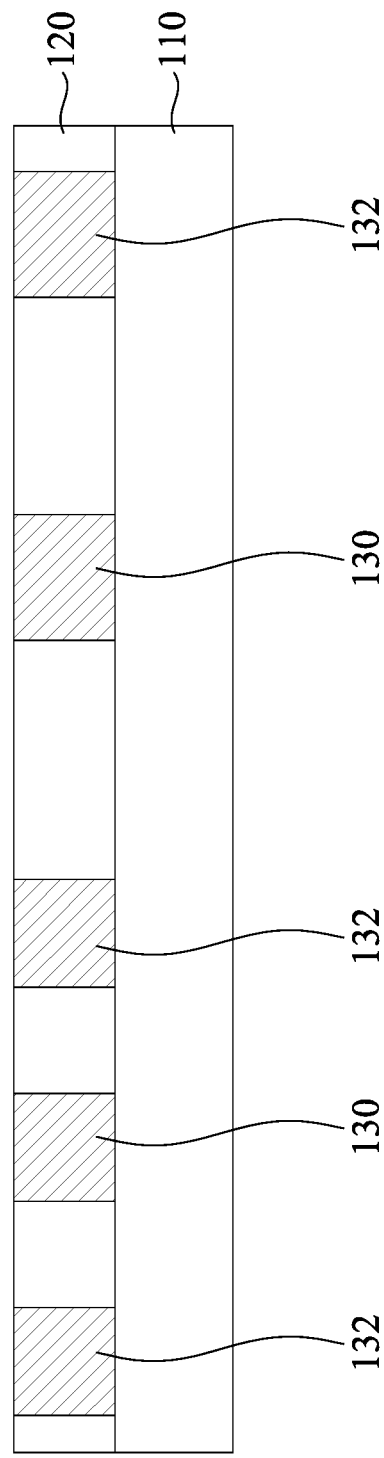
FIG. 1 to FIG. 11 illustrate a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Some embodiments of this disclosure relate to a semiconductor structure and more specifically to the semiconductor structure including multiple etch stop layers. Because the etch stop layers are beneficial for conductive vias to be formed aligned with underlying conductive features, contact area between the conductive vias and the conductive features can be increased and thus the overlay shift problem can be improved.

FIG. 1 to FIG. 11 illustrate a method for manufacturing a semiconductor structure at various stages in accordance with some embodiments of the present disclosure. Reference is made to FIG. 1. A wafer 110 is provided. The wafer 110 includes a dielectric layer. The wafer 110 may include a substrate (not explicitly shown) underlying the dielectric layer, and may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer. The insulator layer is provided on a substrate and may be a silicon or glass substrate. Other substrates, such as a multi-layered or gradient substrate may also be used.

In some embodiments, electrical circuitry is formed on the substrate and may be some types of circuitry suitable for a particular application. In some embodiments, the electrical circuitry includes electrical devices formed on the substrate with one or more dielectric layers overlying the electrical devices. Metal layers may be formed between overlying dielectric layers, such as those discussed herein, to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The dielectric layer may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, $SiO_xC_yH_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra low-k materials (e.g., having a dielectric constant less than about 2.9), such as k=2.5–2.6, may also be used. These materials and processes are provided as examples and other materials and processes may be used.

A dielectric layer 120 is then formed over the wafer 110. In some embodiments, the dielectric layer 120 may include, for example, silicon oxide, SiOCH, silicon nitride, low-k silicon oxide such as a porous silicon oxide layer, other suitable dielectric material, combinations thereof, or the like. In some embodiments, the dielectric layer 120 is a low-k dielectric layer made from extra low-k materials, extreme low-k materials, combinations thereof, or the like. In some embodiments, the dielectric layer 120 may have a dielectric constant lower than 2.4. In various examples, the dielectric layer 120 may be deposited by an ALD process, a CVD process, a subatmospheric CVD (SACVD) process, a flowable CVD process, a PVD process, or other suitable process.

Thereafter, a plurality of conductive features 130 and 132 are formed embedded in the dielectric layer 120. In other words, the dielectric layer 120 laterally surrounds the conductive features 130 and 132. In some embodiments, the method of forming the conductive features 130 and 132 may include etching the dielectric layer 120 to form trenches exposing the wafer 110, and then filling conductive materials into the trenches to form the conductive feature 130 and 132. In some embodiments, a planarization process, such as a CMP process, may be performed to remove excess materials. In some embodiments, the conductive features 130 and 132 include metal, such as cobalt (Co). In some other embodiments, the conductive features 130 and 132 include aluminum (Al), copper (Cu), tungsten (W), ruthenium (Ru), or other suitable conductive materials. In still some other embodiments, the conductive features 130 and 132 may be a bilayer structure (e.g., a barrier layer and a filling metal formed on the barrier layer).

Figure 2:
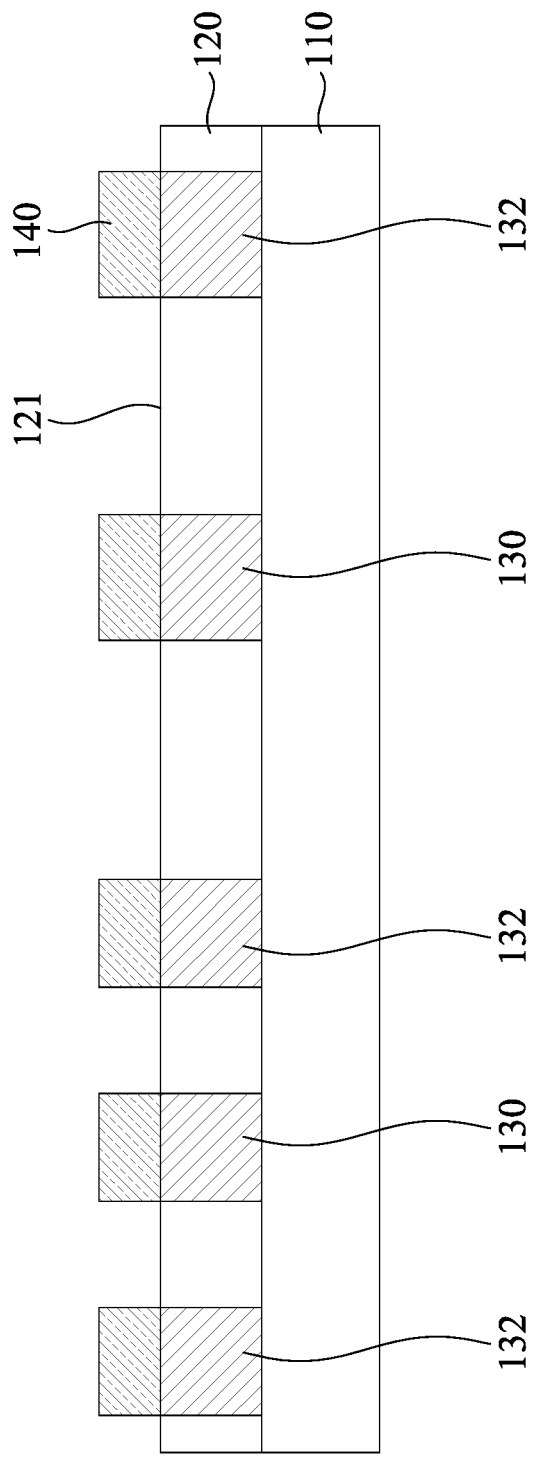

Reference is made to FIG. 2. After the conductive features 130 and 132 are formed, an inhibitor 140 is formed over the wafer 110. In greater details, the inhibitor 140 is selectively formed on conductive materials (i.e., the conductive features 130 and 132), while leaving a top surface 121 of the dielectric layer 120 exposed. The inhibitor 140 includes a material that can suppress subsequent deposition on the conductive materials (i.e., the conductive features 130 and 132). In some embodiments, the inhibitor 140 is formed aligned to the conductive features 130 and 132. Specifically, a vertical projection of the inhibitor 140 on the wafer 110 overlaps with a vertical projection of the conductive features 130/132 on the wafer 110.

In some embodiments, the inhibitor 140 includes organic materials, in which the organic materials include carbon, hydrogen, nitrogen, sulfur, or combinations thereof. In some embodiments, the inhibitor 140 is polymer or self-assemble monolayer (SAM). The SAM inhibitor includes silane-type inhibitor or thiol-type inhibitor. In some embodiments, the silane-type inhibitor may be Octadecyltrichlorosilane ($CH_3(CH_2)_{17}SiC_{13}$), Trichloro(1H, 1H, 2H, 2H-perfluorooctyl) silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si$—$NC_4H_8$), Hexamethyldisilazane ($[(CH_3)_3Si]_2NH$), or Bis(dimethylamino)dimethylsilane ($[(CH_3)_2N]_2Si(CH_3)_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, thiol-type inhibitor can be selectively formed on conductive materials (e.g., the conductive features 130 and 132), and not formed on dielectric materials (e.g., the dielectric layer 120).

In some embodiments where the inhibitor 140 is a self-assemble monolayer (SAM), the molecules of the inhibitor 140 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments, where the inhibitor 140 is a self-assemble monolayer (SAM), the inhibitor 140 includes octadecylphosphonic acid (POOH terminal group), dodecyl acetic acid (COOH terminal), or other suitable materials. In some embodiments where the inhibitor 140 includes alkanethiosls (X—$(CH_2)_n$—SH), the head group can be bound to a surface of a metal material. As such, the inhibitor 140 can be selectively formed (grown) on conductive materials (e.g., the conductive features 130 and 132), and not formed on dielectric materials (e.g., the dielectric layer 120).

Figure 3:
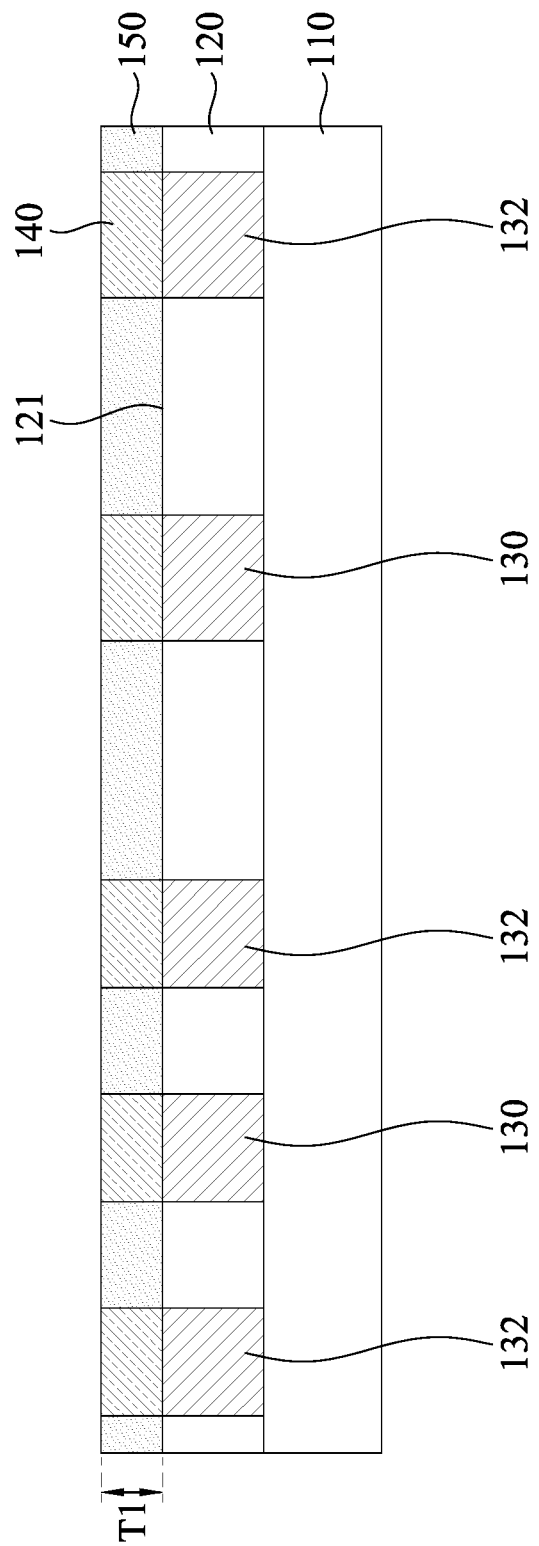

Reference is made to FIG. 3. A first etch stop layer 150 is formed over the dielectric layer 120. In some embodiments, an atomic layer deposition (ALD) process is employed to form the first etch stop layer 150 self-aligned to the exposed top surface 121 of the dielectric layer 120. The ALD process employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles.

Due to the material properties of the inhibitor 140, e.g., the dielectric material repellence property of the inhibitor 140, precursors of the ALD process have a tendency not to adhere to the surface (e.g., top surface) of the inhibitor 140. Thus, during the ALD process, the first etch stop layer 150 may be formed over the dielectric layer 120, but leaving the top surface of the inhibitor 140 uncovered.

In some embodiments, the first etch stop layer 150 includes metal oxide, such as aluminum oxide ($Al_2O_3$). In some embodiments, the first etch stop layer 150 includes other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Si_3N_4$, oxynitrides (SiON), combinations thereof, or other suitable material.

In some embodiments, the first etch stop layer 150 has a thickness T1 in a range of about 10 angstroms (Å) to about 30 angstroms. If the thickness T1 is less than about 10 angstroms, the dielectric layer 120 may be damaged by subsequent plasma processes (e.g., plasma treatment P in FIG. 6); if the thickness T1 is greater than about 30 angstroms, resistance-capacitance (RC) delay may occur, thereby adversely affecting performance of the semiconductor structure.

Figure 4:
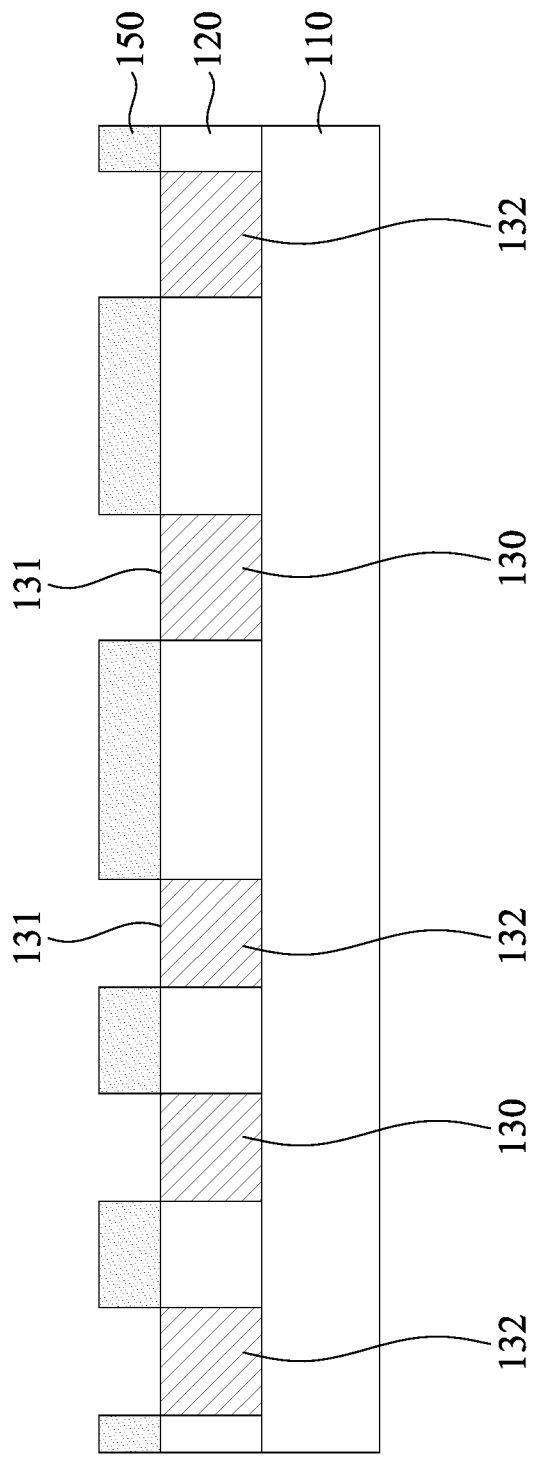

Reference is made to FIG. 3 and FIG. 4. After the first etch stop layer 150 is formed on the dielectric layer 120, the inhibitor 140 is removed to expose top surface 131 of the conductive features 130 and 132. The inhibitor 140 is removed by baking or etching process. In some embodiments where the inhibitor 140 is removed by baking, the baking temperature may be in a range of about 300° C. to 500° C. (e.g., 400° C.) to volatilize the inhibitor 140. In some other embodiments where the inhibitor 140 is removed by etching, a plasma treatment is performed by utilizing a reactant, such as hydrogen ($H_2$), ammonium hydroxide ($NH_4OH$), or other suitable reactant. A radio frequency (RF) power used in the plasma treatment may be in a range of about 40 Watt to about 60 Watt (e.g., 50 Watt).

Figure 5:
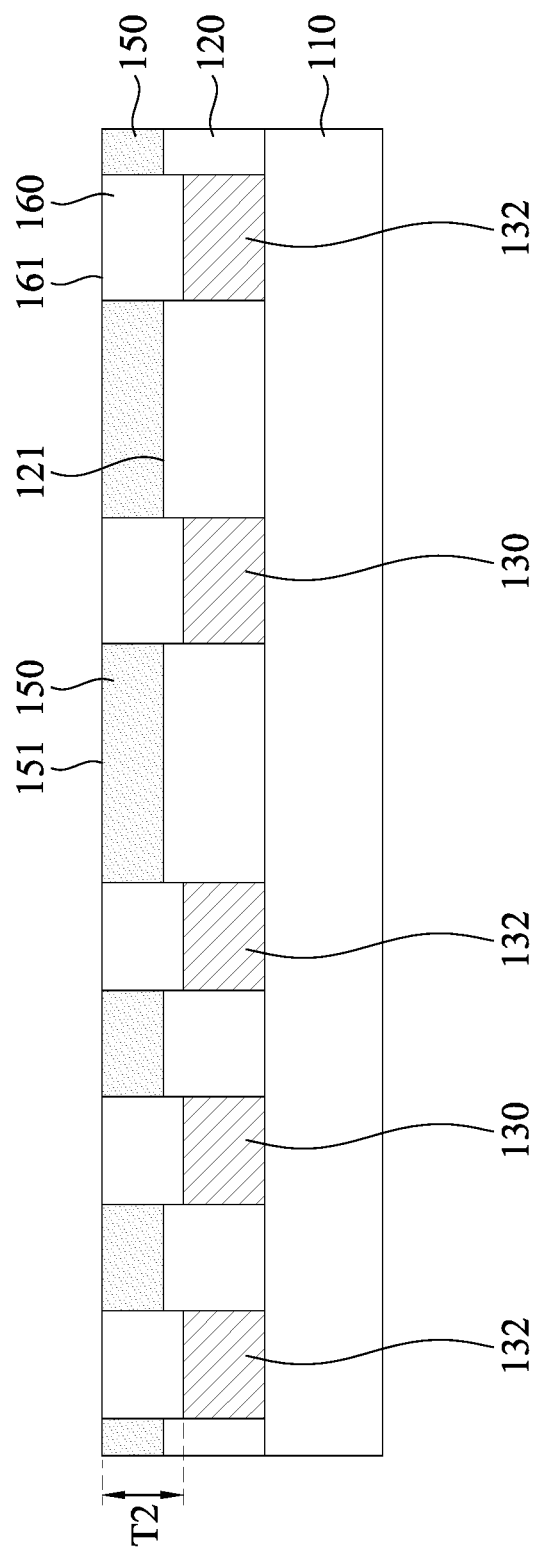

Reference is made to FIG. 5. Capping layers 160 are formed on the conductive features 130 and 132. The capping layers 160 are in contact with the first etch stop layer 150 and the conductive features 130 and 132. After the deposition of the capping layer 160, a planarization process, such as a chemical mechanical planarization (CMP) process, may be then performed to remove excess materials. In some embodiments, the capping layers 160 are formed by performing a selectively growing process. Specifically, the capping layers 160 are selectively grown on a metal (e.g., conductive features 130 and 132 in this case), and thus the capping layers 160 are formed on the conductive features 130 and 132 while not formed on the first etch stop layer 150. As such, in this case, additional processes can be omitted (e.g., forming the capping layers 160 on the conductive features 130 and 132 and the first etch stop layer 150 and then removing the capping layers 160 on the first etch stop layer 150), thereby saving the manufacture cost. In some embodiments, the capping layers 160 can be referred as an etch stop layer.

In some embodiments, the capping layer 160 includes metal nitride, such as aluminum nitride (AlN). In some embodiments, the capping layer 160 includes other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Si_3N_4$, oxynitrides (SiON), combinations thereof, or other suitable material. In some embodiments, the capping layer 160 and the first etch stop layer 150 are made of different materials. For example, the capping layer 160 is made of metal nitride, while the first etch stop layer 150 is made of metal oxide. In some embodiments, the capping layer 160 and the first etch stop layer 150 include the same metal. For example, the capping layer 160 and the first etch stop layer 150 include aluminum.

In some embodiments, the capping layer 160 can prevent the conductive features 130 and 132 from diffusing by subsequent deposition processes. In some embodiments, the capping layer 160 can be configured to form a bonding layer (e.g., bonding layer 170 in FIG. 6) between the capping layer 160 and the conductive features 130 and 132, and thus the electrical performance of the conductive features 130 and 132 can be improved.

In some embodiments, the capping layer 160 has a thickness T2 in a range of about 10 angstroms to about 30 angstroms. If the thickness T2 is less than about 10 angstroms, the conductive features may be damaged by subsequent etching processes (e.g., etching processes in FIG. 9 and FIG. 10); if the thickness T2 is greater than about 30 angstroms, resistance-capacitance (RC) delay may occur, thereby adversely affecting performance of the semiconductor structure. In some embodiments, the capping layer 160 has the thickness T2 the same as the thickness T1 (see FIG. 3) of the first etch stop layer 150.

In some embodiments, a top surface 161 of the capping layer 160 is substantially coplanar with a top surface 151 of the first etch stop layer 150. In some embodiments, a bottom surface 163 of the capping layer 160 is lower than a top surface 121 of the dielectric layer 120.

Figure 6:
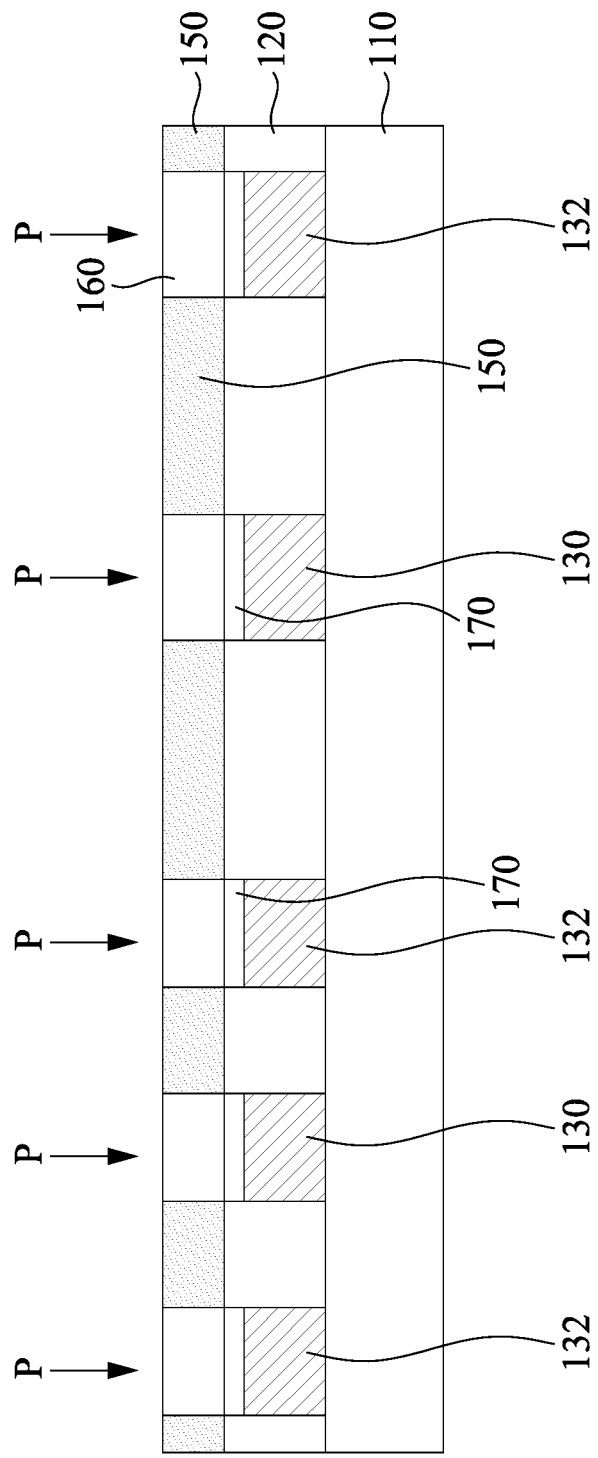

Reference is made to FIG. 6. A plasma treatment P is performed on the capping layers 160 to improve adhesion between the capping layers 160 and the conductive features 130 and 132. As such, bonding layers 170 are formed at interfaces between the capping layers 160 and the conductive features 130 and 132. The bonding layers 170 can provide high quality bonding between the conductive features 130 and 132 and underlying structures (e.g., conductive vias 210 in FIG. 11), thereby improving the electrical performance of the semiconductor structure. In some embodiments, since the first etch stop layer 150 is disposed over the dielectric layer 120, the first etch stop layer 150 can protect the underlying dielectric layer 120 and not damaged by the plasma treatment P.

In some embodiments, the plasma treatment P is performed by utilizing a nitrogen-containing gas, such as $N_2$, $NH_3$, combinations thereof, or other suitable gases. Since the nitrogen-containing gas is used in the plasma treatment P, a material of the bonding layers 170 include nitrogen. In some embodiments, a nitrogen concentration in the bonding layers 170 is greater than a nitrogen concentration in other portions of the conductive features 130 and 132 below the bonding layers 170. In some embodiments, the nitrogen concentration in the bonding layers 170 is less than a nitrogen concentration in the capping layer 160. Further, nitrogen of the bonding layers 170 may bond to the materials (e.g., metals) of the conductive features 130 and 132, such that the bonding layers 170 and the conductive features 130 and 132 may include common elements. For example, the bonding layers 170 include Al, Cu, W, and/or Ru when the conductive features 130 and 132 are made of Al, Cu, W, and/or Ru.

In some embodiments, a RF power used in the plasma treatment P may be in a range of about 100 Watt to about 1000 Watt. If the RF power is less than about 100 Watt, the plasma would not reach top portions of the conductive features 130 and 132, thereby adversely affecting the formation of the bonding layers 170; if the RF power is greater than about 1000 Watt, the plasma would passes through the first etch stop layer 150 and damage the dielectric layer 120. In some embodiments, dual frequencies (e.g., about 100 Watt and about 1000 Watt) are applied to the plasma treatment P. The lower frequency (e.g., about 100 Watt) forms the plasma, and the higher frequency (e.g., about 1000 Watt) provides the energy to form the bonding layers 170.

Figure 7:
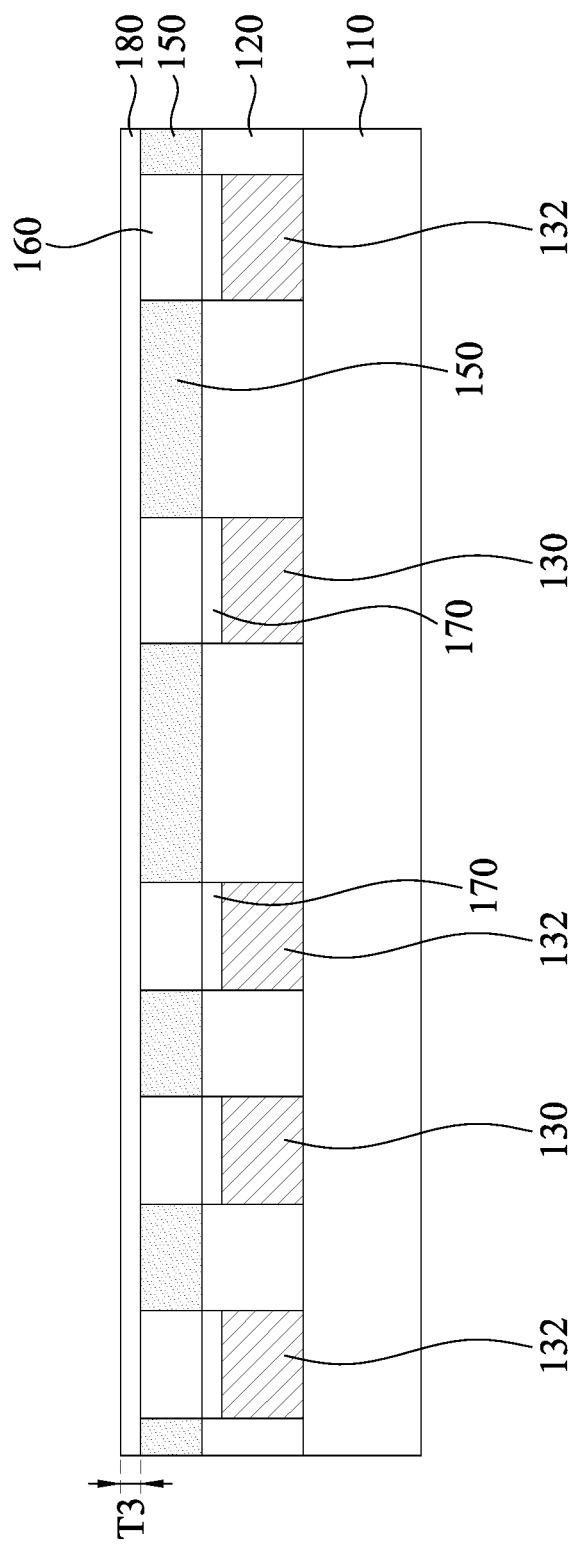

Reference is made to FIG. 7. A second etch stop layer 180 is formed over the structure of FIG. 6. In greater details, the second etch stop layer 180 covers the first etch stop layers 150 and the capping layers 160. In some embodiments, the second etch stop layer 180 can be a stressed layer or layers. In some embodiments, the second etch stop layer 180 has a tensile stress and is formed of $Si_3N_4$. In some other embodiments, the second etch stop layer 180 includes materials such as oxynitrides.

In some embodiments, the second etch stop layer 180 may have a composite structure including a plurality of layers. For example, the second etch stop layer 180 includes a first layer and a second layer overlying the first layer. The first layer may be a silicon oxynitride (SiOC) layer and a second layer may be an aluminum oxide layer. The first layer of the second etch stop layer 180 may have a thickness in a range of about 30 angstroms to about 70 angstroms, and the second layer of the second etch stop layer 180 may have a thickness in a range of about 20 angstroms to about 30 angstroms.

In some embodiments, the second etch stop layer 180 has a thickness T3 in a range of about 30 angstroms to about 70 angstrom. If the thickness T3 is less than about 30 angstroms, a width of an opening (e.g., opening 202 in FIG. 9) in the second etch stop layer 180 would not be controlled and cause overhang of metal deposition; if the thickness T3 is greater than about 70 angstroms, resistance-capacitance (RC) delay may occur, thereby adversely affecting performance of the semiconductor structure. In some embodiments, the thickness T3 of the second etch stop layer 180 is greater than or equal to the thickness T1 (see FIG. 3) of the first etch stop layers 150. In some embodiments, the thickness T3 of the second etch stop layer 180 is greater than or equal to the thickness T2 (see FIG. 5) of the capping layers 160.

In some embodiments, the second etch stop layer 180 can be formed using plasma enhanced CVD (PECVD), however, other suitable methods, such as low pressure CVD (LPCVD), atomic layer deposition (ALD), and the like, can also be used. In some embodiments, the second etch stop layer 180 and the first etch stop layers 150 are made of different materials, and the first etch stop layers 150 have sufficient etch selectivity (e.g., about 2 times or higher) with respect to the second etch stop layer 180. As such, the first etch stop layers 150 can slow down the etching process of forming openings 202 (see FIG. 9), which in turn prevents over-etching the dielectric layer 120.

Figure 8:
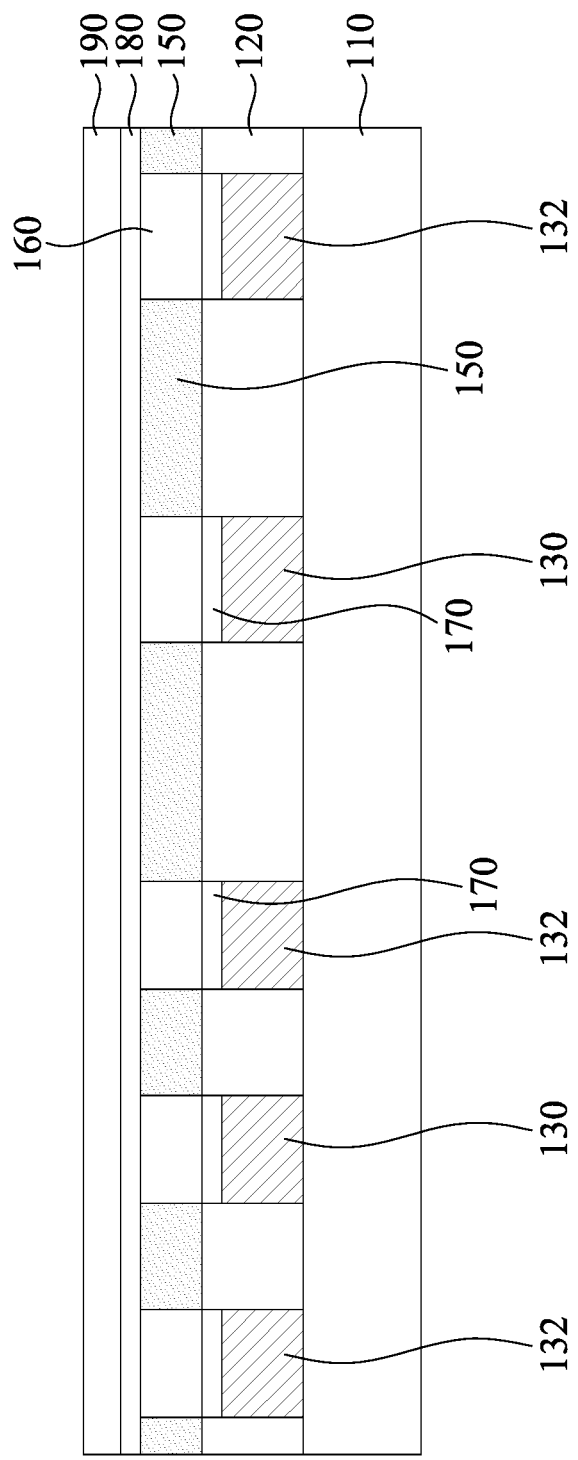

Reference is made to FIG. 8. Another dielectric layer 190 is formed over the structure of FIG. 7. In other words, the dielectric layer 190 covers the second etch stop layer 180. In some embodiments, the dielectric layer 190 may include, for example, silicon oxide, SiOCH, silicon nitride, low-k silicon oxide such as a porous silicon oxide layer, other suitable dielectric material, combinations thereof, or the like. In some embodiments, the dielectric layer 190 is a low-k dielectric layer made from extra low-k materials, extreme low-k materials, combinations thereof, or the like. In some embodiments, the dielectric layer 190 may have a dielectric constant lower than 2.4. In various examples, the dielectric layer 190 may be deposited by an ALD process, a CVD process, a subatmospheric CVD (SACVD) process, a flowable CVD process, a PVD process, or other suitable process.

Figure 9:
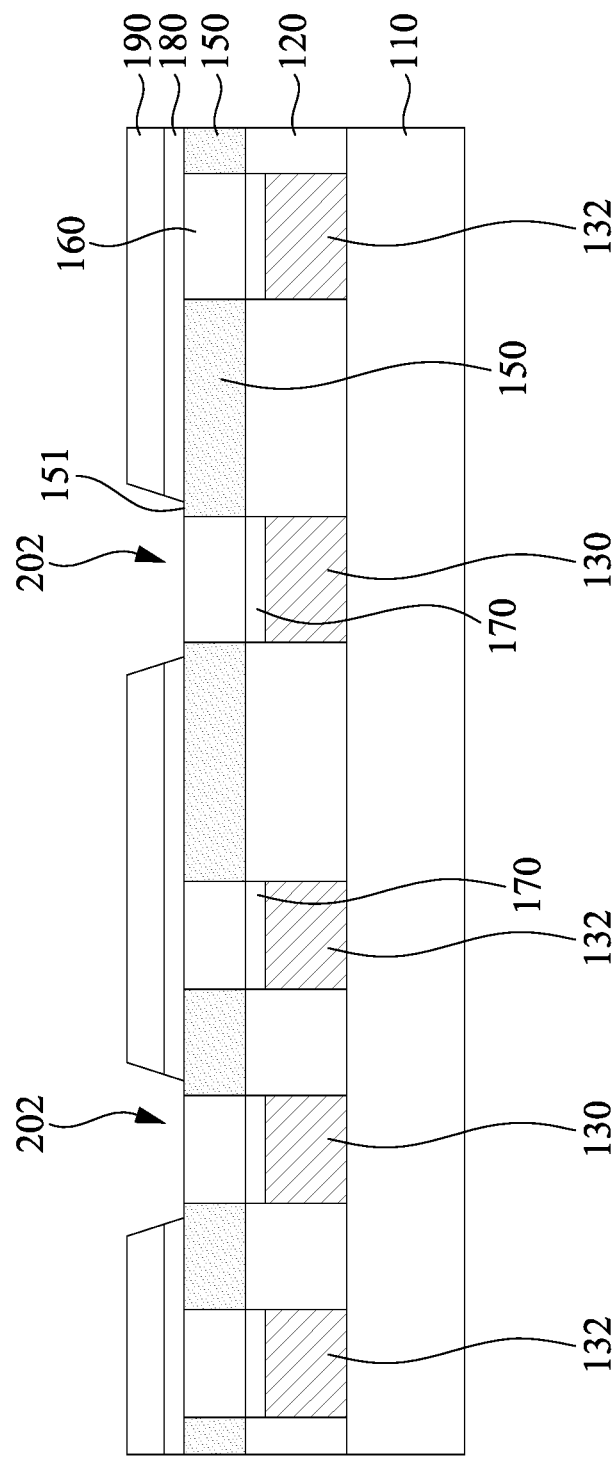

Reference is made to FIG. 9. After the dielectric layer 190 is formed, a first etching process is performed to form at least one opening 202 in the dielectric layer 190 and the second etch stop layer 180 such that some of the capping layers 160 are exposed. Further, in some embodiments, due to process variations, certain misalignment (or overlay error) may exist between the openings 202 and the capping layers 160. Or, the size (or width) of the openings 202 may be greater than the size (or the width) of the capping layers 160 in some embodiments. Either way, the openings 202 may expose portions of the top surface 151 of the first etch stop layers 150. In some embodiments, a patterned mask (not shown) is formed over the conductive features 130 and 132 prior to performing the first etching process. The second etch stop layer 180 and the dielectric layer 190 are etched using the patterned mask as an etch mask, such that the openings 202 are formed over the conductive features 130, while the second etch stop layer 180 and the dielectric layer 190 remain covering the conductive features 132.

The second etch stop layer 180 has a material (e.g., high-K dielectric materials) that different from the dielectric layer 190 (e.g., low-K dielectric materials), thus resulting in different etch selectivity between the second etch stop layer 180 and the dielectric layer 190. Due to the etching selectivity between the second etch stop layer 180 and the dielectric layer 190, the second etch stop layer 180 can slow down the etching process of forming the openings 202, which in turn prevents over-etching the dielectric materials under the second etch stop layer 180. Further, a maximum width of the opening 202 in the second etch stop layer 180 is smaller than a maximum width of the opening 202 in the dielectric layer 190, and thus the opening 202 has a tapered profile. In some other embodiments, the etching conditions of the etching process may be fined-tune to allow the openings 202 having vertical sidewall profile.

In some embodiments, the first etching process of forming the opening 202 may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3$:$NH_4F$:$H_2O$, and/or the like.

Figure 10:
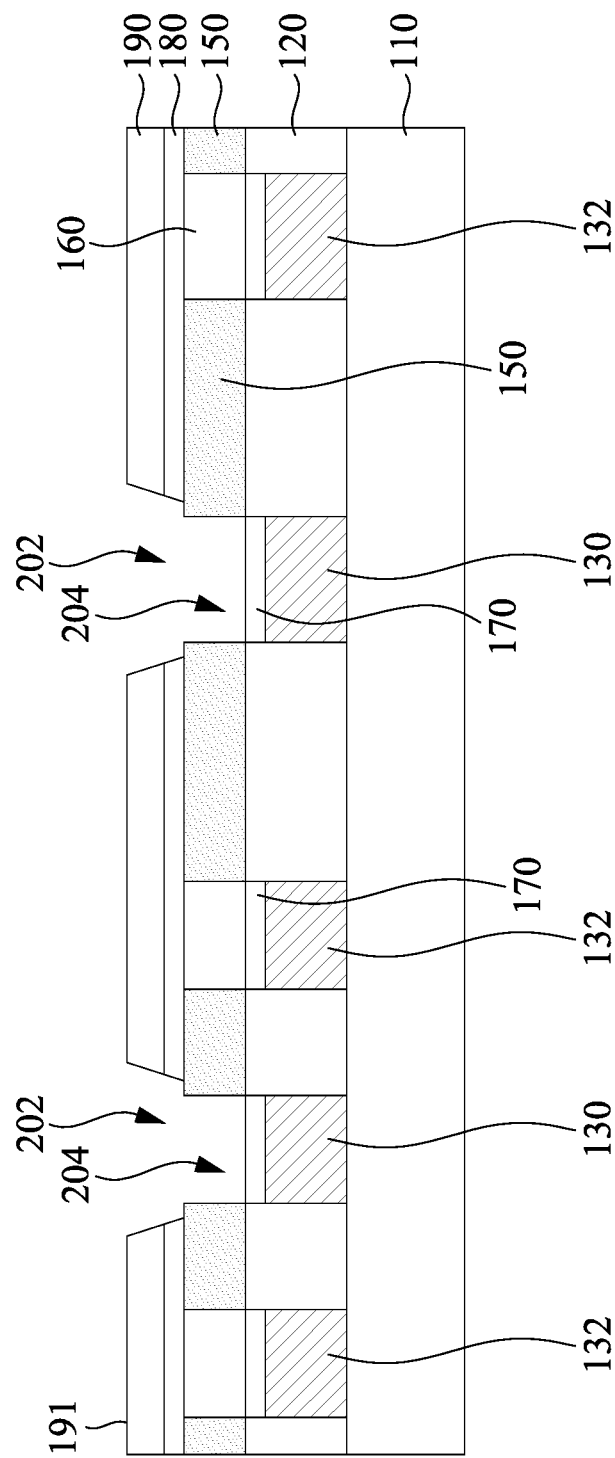

Reference is made to FIG. 10. A second etching process is performed to form at least one opening 204 communicated to the opening 202, such that the bonding layer 170 of the conductive features 130 is exposed. In some embodiments, the opening 202 is in the second etch stop layer 180 and the dielectric layer 190, and the opening 204 is in the first etch stop layer 150. The first etch stop layer 150 protrudes from the second etch stop layer 180. In some embodiments, a maximum width of the opening 204 is smaller than a maximum width of the opening 202.

In some embodiments, the first etch stop layer 150 includes metal oxide and the capping layers 160 includes metal nitride. It has been observed that the etch rate of metal nitride increases when the etching plasma is generated from a gaseous mixture containing a hydrogen ($H_2$) gas. As a result, the second etching process is performed using a hydrogen-containing gaseous mixture for inhibiting metal oxide etch rate, in accordance with some embodiments of the present disclosure. Stated differently, the plasma in the second etching process is generated in a gaseous mixture including hydrogen ($H_2$) gas. In this way, etch rate of metal oxide keeps low in the etching process, which in turn allows for etching metal nitride (i.e., the capping layers 160) at a faster etch rate than etching metal oxide (i.e., the first etch stop layer 150). In some embodiments, the etching process of forming the opening 202 may use wet etching. The etching solution (etchant) of the wet etching may include $NH_4OH:H_2O_2:H_2O$ (APM), $NH_2OH$, KOH, $HNO_3$:$NH_4F$:$H_2O$, and/or the like. Due to the etch selectivity between the capping layers 160 and the first etch stop layer 150, the first etch stop layer 150 can slow down or even stop the etching process of forming the openings 204, which in turn prevents over-etching the dielectric materials under the first etch stop layer 150 and results in reduced risk of leakage current.

Figure 11:
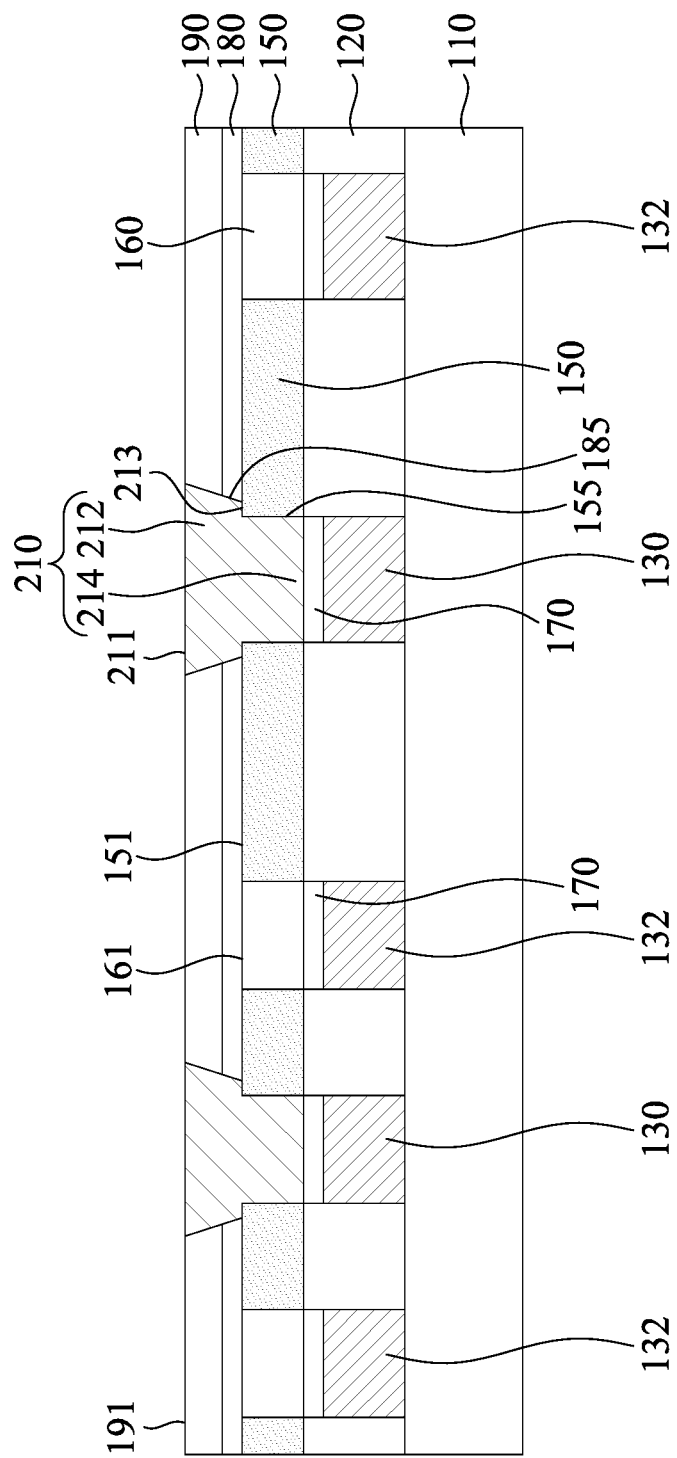

Reference is made to FIG. 10 and FIG. 11. Conductive materials are filled in the openings 202 and 204 to form conductive vias 210. The conductive vias 210 are electrically connected to the conductive features 130, respectively. In some embodiments, the conductive vias 210 include metal, such as W, Co, Ru, Al, Cu, or other suitable materials. After the deposition of the conductive vias 210, a planarization process, such as a chemical mechanical planarization (CMP) process, may be then performed to remove excess conductive material outside the openings 202 and 204. In some embodiments, the conductive vias 210 extend upwards from the bonding layer 170 of the conductive features 130 and formed in the first etch stop layer 150, the second etch stop layer 180, and the dielectric layer 190. The conductive via 210 has a top portion 212 and a bottom portion 214 in contact with the top portion 212, in which the top portion 212 is formed in the second etch stop layer 180 and the dielectric layer 190, and the bottom portion 214 is formed in the first etch stop layer 150.

Due to configurations of multiple etch stop layers (e.g., the first etch stop layer 150, the capping layer 160, and the second etch stop layer 180), the conductive vias 210 can be formed aligned with the underlying conductive features 130, respectively. As such, contact area between the conductive vias 210 and (the bonding layer 170 of) the conductive features 130 can be increased and thus the overlay shift problem can be improved, thereby improving the performance of the semiconductor structure. For example, time-dependent dielectric breakdown (TDDB) life can be increased.

In some embodiments, a minimum width the top portion 212 of the conductive vias 210 is greater than a width of the bottom portion 214 of the conductive vias 210. In some embodiments, an area of the top portion 212 of the conductive vias 210 is greater than an area of the bottom portion 214 of the conductive vias 210. In some embodiments, the top portion 212 of the conductive vias 210 tapers from the dielectric layer 190 to the second etch stop layer 180. A width variation of the bottom portion 214 is less than a width variation of the top portion 212. For example, the width of the bottom portion 214 is substantially unchanged. Further, the conductive vias 210 have a step (or a notch) at the interface between the second etch stop layer 180 and the first etch stop layers 150. Stated another way, a sidewall 185 of the second etch stop layer 180 facing the 210 is misaligned with a sidewall 155 of the first etch stop layers 150 facing the 210. In other words, an interface (i.e., the sidewall 185) between the conductive via 210 and the second etch stop layer 180 is misaligned with an interface (i.e., the sidewall 155) between the conductive via 210 and the first etch stop layer 150. In some embodiments, the sidewall 185 of the second etch stop layer 180 is more slanted than the sidewall 155 of the first etch stop layers 150.

In some embodiments, the semiconductor structure in FIG. 11 includes the dielectric layer 120, the conductive features 130 and 132, the first etch stop layer 150, and the conductive vias 210. The conductive features 130 and 132 are embedded in the dielectric layer 120. The first etch stop layer 150 is disposed over the dielectric layer 120. The conductive vias 210 are surrounded by the first etch stop layer 150 and electrically connected to the conductive features 130.

In some embodiments, the conductive features 130 and 132 respectively have bonding layers 170 at top portions of the conductive features 130 and 132. The nitrogen concentration of the bonding layers 170 (e.g., top portions of the conductive features 130 and 132 in this case) is greater than other portions of the conductive features 130 and 132. The bonding layers 170 of the conductive features 130 are in contact with the conductive vias 210.

In some embodiments, the conductive vias 210 are spaced apart from the conductive features 132. In some embodiments, the conductive vias 210 has the top portion 212 and the bottom portion 214 in contact with the top portion 212. The top portion 212 is wider than the bottom portion 214. The bottom portion 214 is in contact with the bonding layer 170 of the conductive features 130. The conductive vias 210 are in contact with the top surface 151 of the first etch stop layer 150.

In some embodiments, the semiconductor structure further includes the capping layer 160 disposed over the conductive features 132. In other words, the capping layer 160 overlaps with the conductive features 132, while spaced apart from the conductive features 130. Specifically, a vertical projection of the capping layer 160 on the wafer 110 overlaps with a vertical projection of the conductive features 132 on the wafer 110, while spaced apart from a vertical projection of the conductive features 130 on the wafer 110. In some embodiments, the capping layer 160 is adjacent to the first etching stop layer 150. The capping layer 160 is in contact with the first etching stop layer 150. The top surface 161 of the capping layer 160 is substantially coplanar with the top surface 151 of the first etch stop layer 150. In some embodiments, the conductive vias 210 has a surface 213 between the top portion 212 and the bottom portion 214 of the conductive vias 210. The surface 213 is connected to the sidewall 185 of the second etch stop layer and the sidewall 155 of the first etch stop layer. The surface 213 of the conductive vias 210 is substantially coplanar with the top surface 151 of the first etch stop layer 150 and the top surface 161 of the capping layer 160.

In some embodiments, the semiconductor structure further includes the second etch stop layer 180 over the first etch stop layer 150. The second etch stop layer 180 is in contact with the first etch stop layer 150, the capping layer 160, and the conductive vias 210. In some embodiments, the bottom portion 214 of the conductive vias 210 is surrounded by the first etch stop layer 150, and the top portion 212 of the conductive vias 210 is surround by the second etch stop layer 180.

In some embodiments, the semiconductor structure further includes the dielectric layer 190 over the dielectric layer 190. The dielectric layer 190 covers the second etch stop layer 180. The dielectric layer 190 surrounds the top portion 212 of the conductive vias 210. In some embodiments, a top surface 191 of the dielectric layer 190 is substantially coplanar with the top surface 211 of the conductive vias 210.

Figure 12:
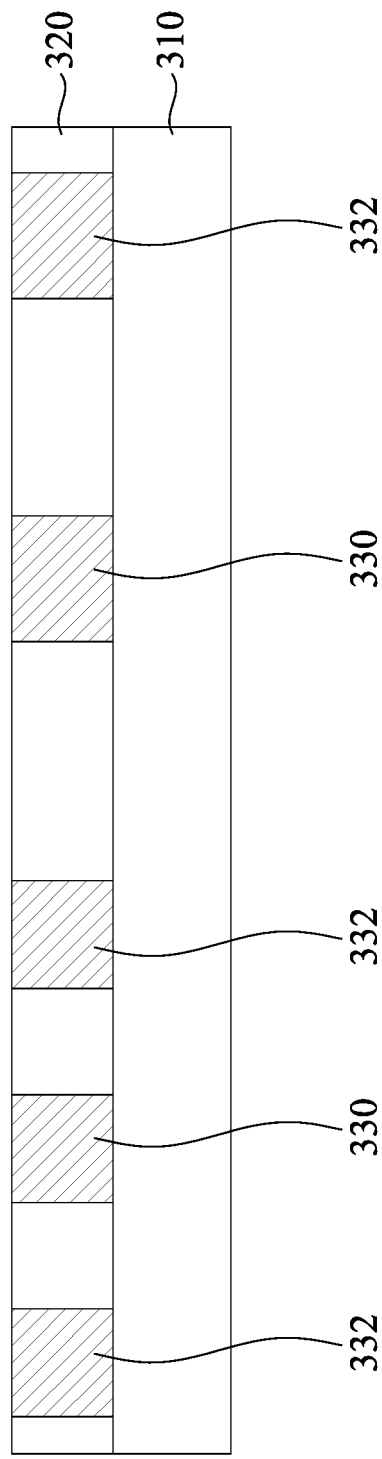
FIG. 12 to FIG. 20 illustrate a method for manufacturing a semiconductor structure at various stages in accordance with some embodiments of the present disclosure.

FIG. 12 to FIG. 20 illustrate a method for manufacturing a semiconductor structure at various stages in accordance with some embodiments of the present disclosure. Reference is made to FIG. 12, in which the structure of FIG. 12 is similar to that described in FIG. 1, and thus relevant structural details (e.g., configurations and materials) will not be repeated hereinafter. For example, a semiconductor structure includes a wafer 310, a first dielectric layer 320, conductive features 330 and 332. The first dielectric layer 320 is formed over the wafer 310. The conductive features 330 and 332 are formed embedded in the first dielectric layer 320. In other words, the first dielectric layer 320 laterally surrounds the conductive features 330 and 332.

Figure 13:
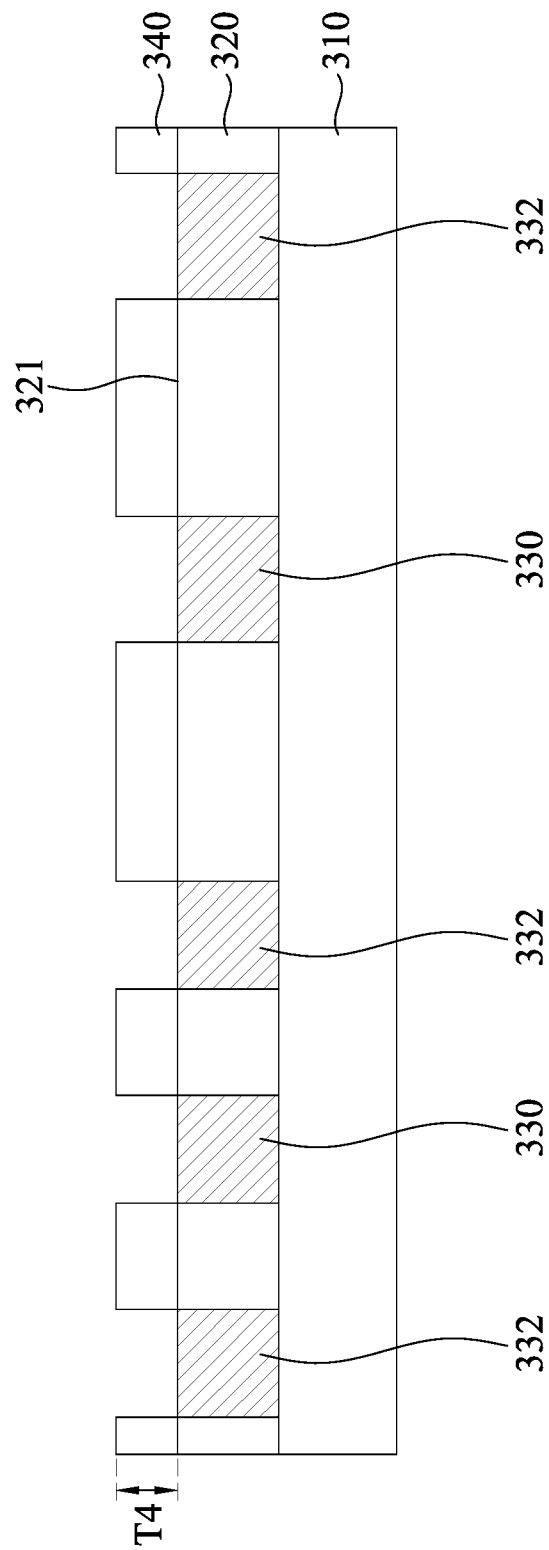

Reference is made to FIG. 13. A second dielectric layer 340 is formed over the first dielectric layer 320. In some embodiments, the second dielectric layer 340 is formed by performing a selectively growing process. Specifically, the second dielectric layer 340 is selectively grown on dielectric materials (e.g., first dielectric layer 320 in this case), and thus the second dielectric layer 340 is formed over the first dielectric layer 320, and not formed over the conductive features 330 and 332. For example, an inhibitor (not shown) can be selectively formed over the conductive features 330 and 332 in advance while leaving the first dielectric layer 320 exposed. The second dielectric layer 340 is then formed over the first dielectric layer 320 and not over the inhibitor.

In some embodiments, the inhibitor can be removed after the formation of the second dielectric layer 340.

In some embodiments, the second dielectric layer 340 may include, for example, silicon oxide, silicon oxide, SiOCH, silicon nitride, low-k silicon oxide such as a porous silicon oxide layer, other suitable dielectric material, combinations thereof, or the like. In some embodiments, the second dielectric layer 340 is a low-k dielectric layer made from extra low-k materials, extreme low-k materials, combinations thereof, or the like. In some embodiments, the second dielectric layer 340 may have a dielectric constant lower than 2.4. In some embodiments, the second dielectric layer 340 includes the same materials as the first dielectric layer 320. In some embodiments, the second dielectric layer 340 has a thickness T4 in a range of about 30 angstroms to about 50 angstroms.

Figure 14:
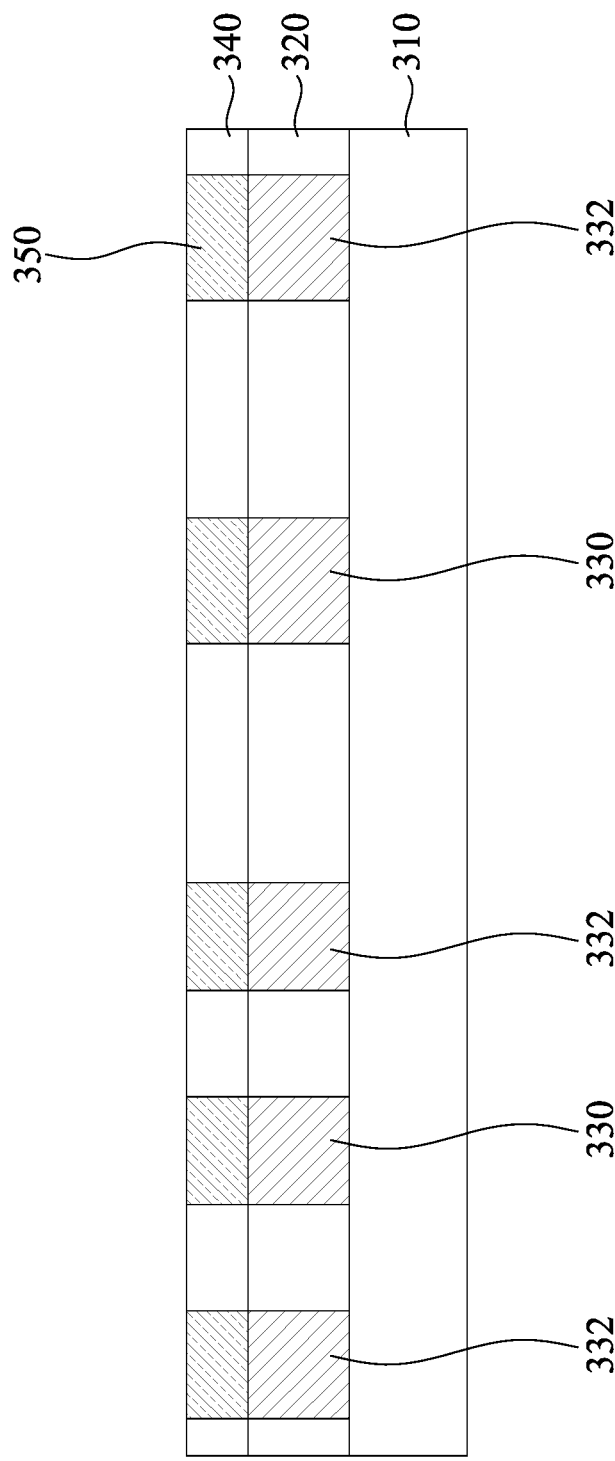

Reference is made to FIG. 14. An inhibitor 350 is formed over the wafer 310. In greater details, the inhibitor 350 is selectively formed on conductive materials (i.e., the conductive features 330 and 332). The inhibitor 350 includes a material that can suppress subsequent deposition on the conductive materials (i.e., the conductive features 330 and 332). In some embodiments, the inhibitor 350 is formed aligned to the conductive features 330 and 332. Specifically, a vertical projection of the inhibitor 350 on the wafer 310 overlaps with a vertical projection of the conductive features 330/332 on the wafer 310.

In some embodiments, the inhibitor 350 includes organic materials, in which the organic materials include carbon, hydrogen, nitrogen, sulfur, or combinations thereof. In some embodiments, the inhibitor 350 is polymer or self-assemble monolayer (SAM). The SAM inhibitor includes silane-type inhibitor or thiol-type inhibitor. In some embodiments, the silane-type inhibitor may be Octadecyltrichlorosilane ($CH_3(CH_2)_{17}SiCl_3$), Trichloro(1H, 1H, 2H, 2H-perfluorooctyl) silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si$—$NC_4H_8$), HexamethyldisiLazane ($[(CH_3)_3Si]_2NH$), or Bis(dimethylamino)dimethylsilane ($[(CH_3)_2N]_2Si(CH_3)_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, thiol-type inhibitor can be selectively formed on conductive materials (e.g., the conductive features 330 and 332), and not formed on dielectric materials (e.g., the second dielectric layer 340).

In some embodiments where the inhibitor 350 is a self-assemble monolayer (SAM), the molecules of the inhibitor 350 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments, where the inhibitor 140 is a self-assemble monolayer (SAM), the inhibitor 140 includes octadecylphosphonic acid (POOH terminal group), dodecyl acetic acid (COOH terminal), or other suitable materials. In some embodiments where the inhibitor 350 includes alkanethiosls (X—$(CH_2)_n$—SH), the head group can be bound to a surface of a metal material. As such, the inhibitor 350 can be selectively formed (grown) on conductive materials (e.g., the conductive features 330 and 332), and not formed on dielectric materials (e.g., the second dielectric layer 340).

Figure 15:
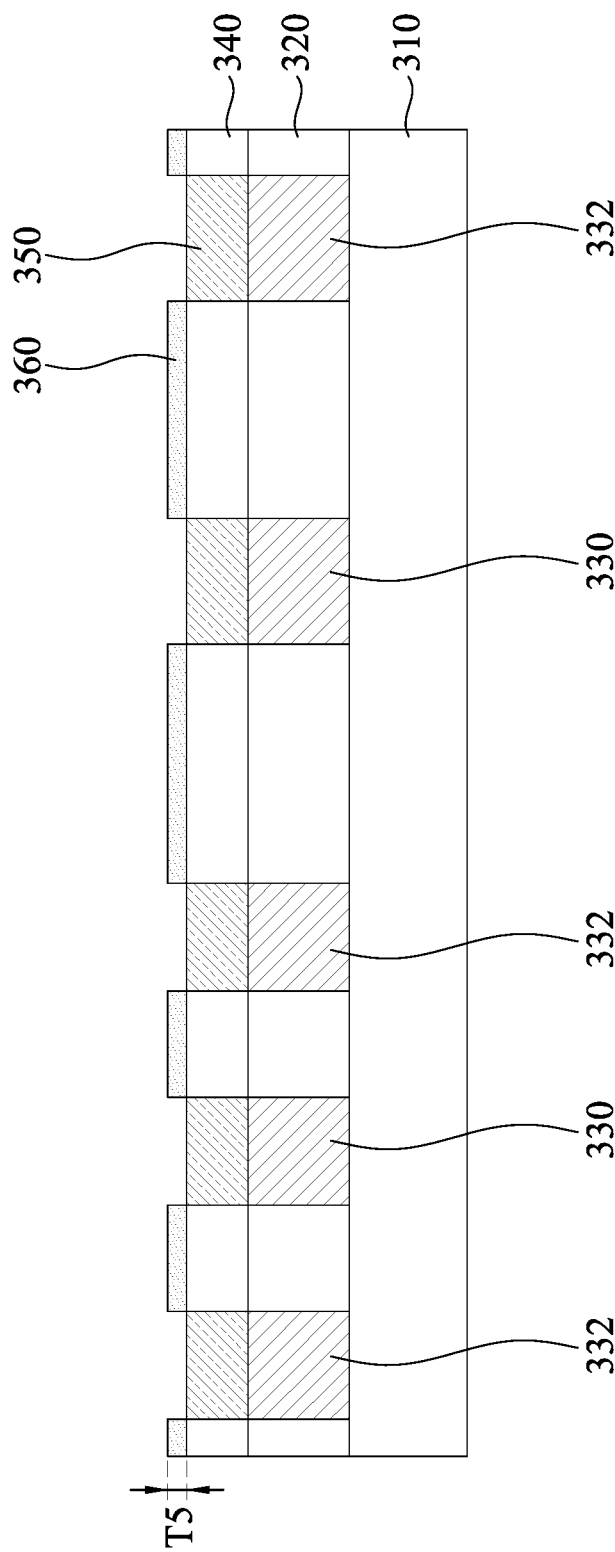

Reference is made to FIG. 15. A first etch stop layer 360 is formed over the second dielectric layer 340. In some embodiments, an atomic layer deposition (ALD) process is employed to form the first etch stop layer 360 self-aligned to the top surface of the second dielectric layer 340, leaving the inhibitor 350 exposed.

Due to the material properties of the inhibitor 350, e.g., the dielectric material repellence property of the inhibitor 350, precursors of the ALD process have a tendency not to adhere to the surface (e.g., top surface) of the inhibitor 350. Thus, during the ALD process, the first etch stop layer 360 may be formed over the second dielectric layer 340, but leaving the top surface of the inhibitor 350 uncovered.

In some embodiments, the first etch stop layer 360 includes metal oxide, such as aluminum oxide ($Al_2O_3$). In some embodiments, the first etch stop layer 360 includes other high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Si_3N_4$, oxynitrides (SiON), combinations thereof, or other suitable material.

In some embodiments, the first etch stop layer 360 has a thickness T5 in a range of about 10 angstroms to about 20 angstroms. If the thickness T5 is less than about 10 angstroms, the second dielectric layer 340 may be damaged by subsequent etching processes (e.g., etching process in FIG. 19); if the thickness T5 is greater than about 20 angstroms, resistance-capacitance (RC) delay may occur, thereby adversely affecting performance of the semiconductor structure. In some embodiments, the thickness T5 of the first etch stop layer 360 is smaller than the thickness T4 (see FIG. 13) of the second dielectric layer 340.

Figure 16:
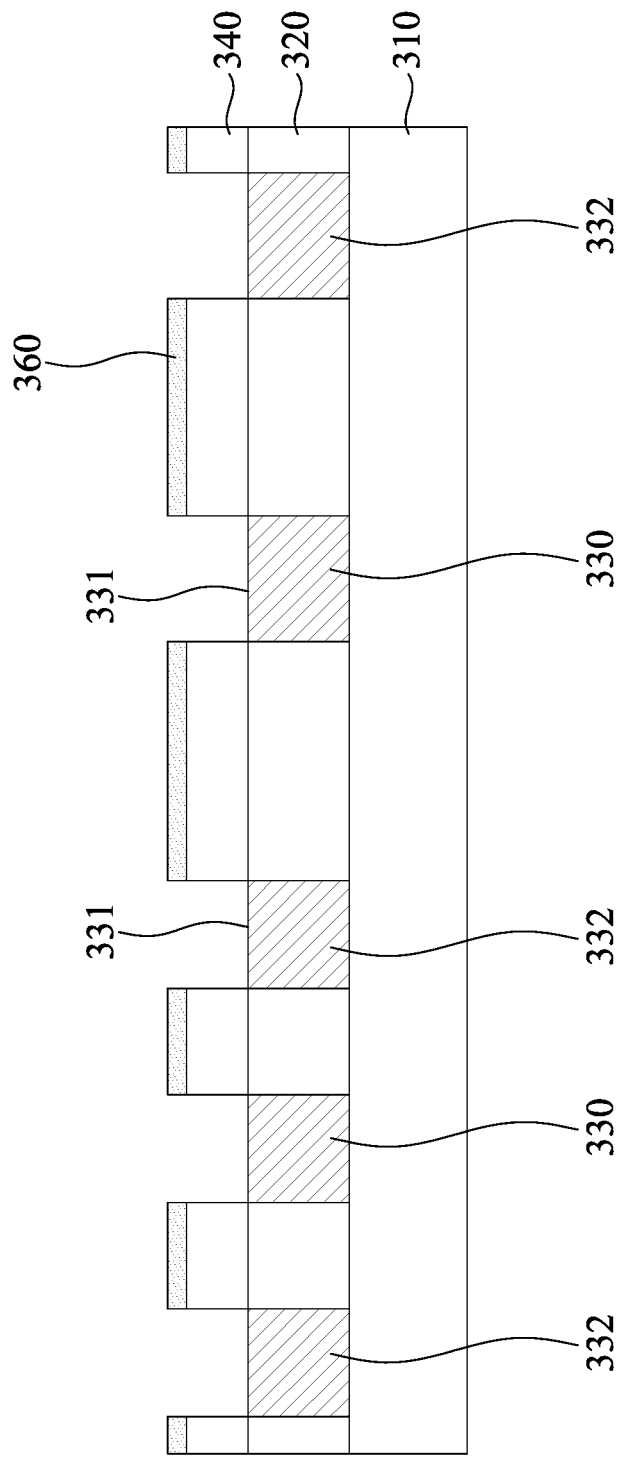

Reference is made to FIG. 16. After the first etch stop layer 360 is formed on the second dielectric layer 340, the inhibitor 350 is removed to expose a top surface 331 of the conductive feature 330 and a top surface 331 of the conductive feature 332. The inhibitor 350 is removed by baking or etching process. In some embodiments where the inhibitor 350 is removed by baking, the baking temperature may be in a range of about 300° C. to about 500° C. (e.g., about 400° C.) to volatilize the inhibitor 350. In some other embodiments where the inhibitor 350 is removed by etching, a plasma treatment is performed by utilizing a reactant, such as hydrogen ($H_2$), ammonium hydroxide ($NH_4OH$), or other suitable reactant. A radio frequency (RF) power used in the plasma treatment may be in a range of about 40 Watt to about 60 Watt (e.g., about 50 Watt).

Figure 17:
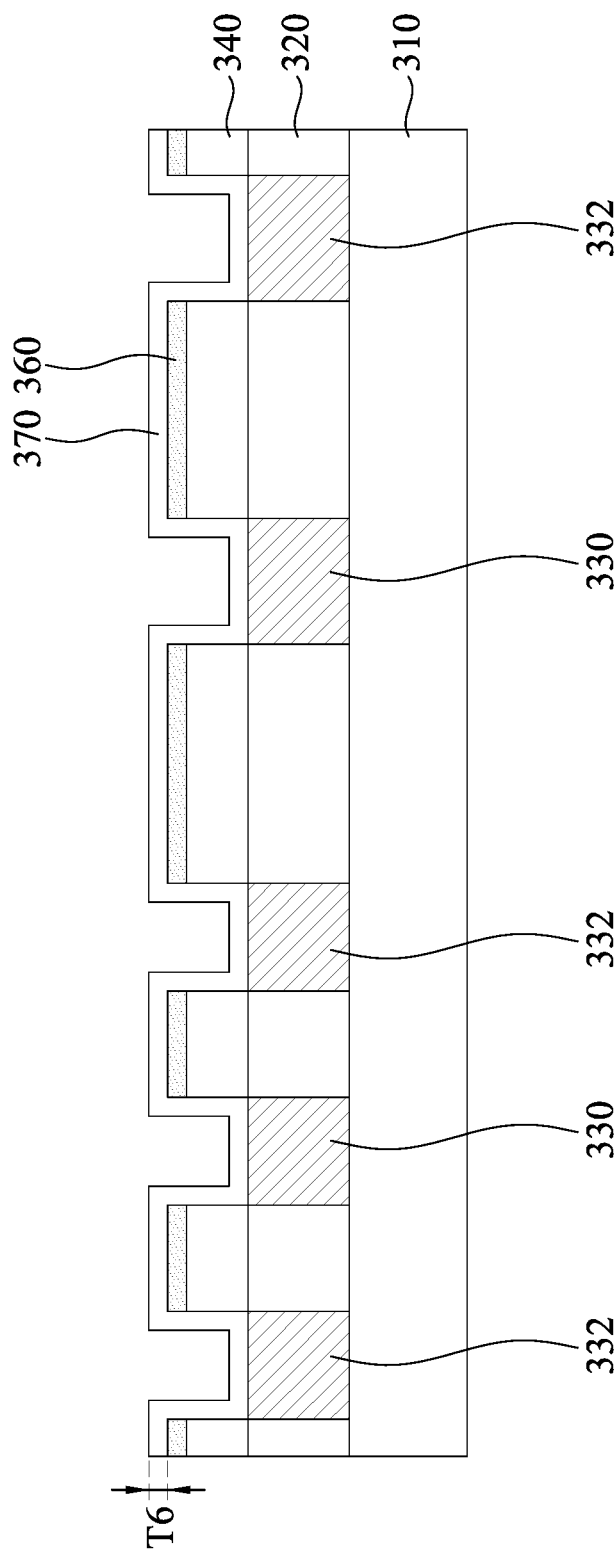

Reference is made to FIG. 17. A second etch stop layer 370 is conformally formed over the structure of FIG. 16. In greater details, the second etch stop layer 370 covers the first etch stop layer 360 and the conductive features 330 and 332. In some embodiments, the second etch stop layer 370 can be a stressed layer or layers. In some embodiments, the second etch stop layer 370 has a tensile stress and is formed of $Si_3N_4$. In some other embodiments, the second etch stop layer 370 includes materials such as oxynitrides.

In some embodiments, the second etch stop layer 370 may have a composite structure including a plurality of layers. For example, the second etch stop layer 370 includes a first layer, a second layer overlying the first layer, and a third layer overlying the second layer. The first layer may be an aluminum nitride layer, the second layer may be a silicon oxynitride (SiOC) layer and a third layer may be an aluminum oxide layer. The first layer of the second etch stop layer 370 may have a thickness in a range of about 10 angstroms to about 30 angstroms, the second layer of the second etch stop layer 370 may have a thickness in a range of about 30 angstroms to about 70 angstroms, and the third layer of the second etch stop layer 370 may have a thickness in a range of about 20 angstroms to about 30 angstroms.

In some embodiments, the second etch stop layer 370 has a thickness T6 in a range of about 60 angstroms to about 130 angstrom. If the thickness T6 is less than about 60 angstroms, a width of an opening (e.g., opening 390 in FIG. 19) in the second etch stop layer 370 would not be controlled and cause overhang of metal deposition; if the thickness T6 is greater than about 130 angstroms, resistance-capacitance (RC) delay may occur, thereby adversely affecting performance of the semiconductor structure. In some embodiments, the thickness T6 of the second etch stop layer 370 is greater than the thickness T5 (see FIG. 15) of the first etch stop layer 360.

In some embodiments, the second etch stop layer 370 can be formed using plasma enhanced CVD (PECVD), however, other suitable methods, such as low pressure CVD (LPCVD), atomic layer deposition (ALD), and the like, can also be used.

Figure 18:
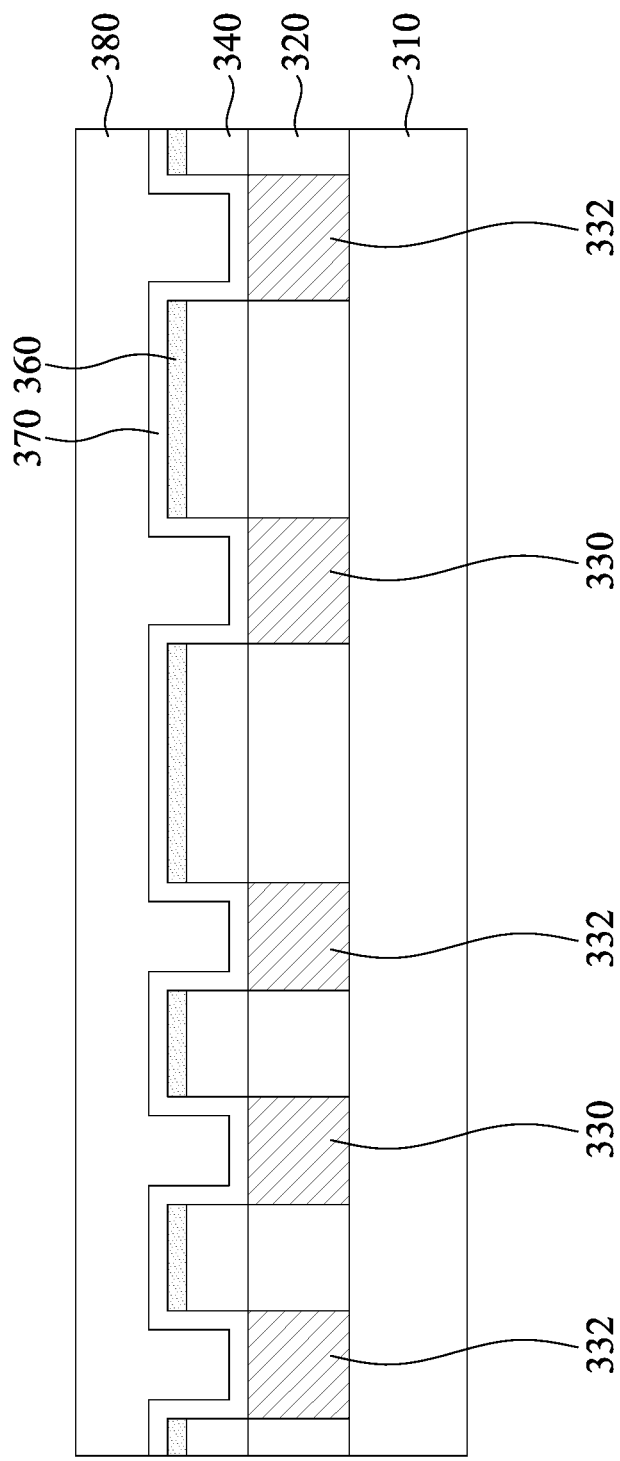

Reference is made to FIG. 18. A third dielectric layer 380 is formed over the structure of FIG. 17. In other words, the third dielectric layer 380 covers the second etch stop layer 370. In some embodiments, the third dielectric layer 380 may include, for example, silicon oxide, SiOCH, silicon nitride, low-k silicon oxide such as a porous silicon oxide layer, other suitable dielectric material, combinations thereof, or the like. In some embodiments, the third dielectric layer 380 is a low-k dielectric layer made from extra low-k materials, extreme low-k materials, combinations thereof, or the like. In some embodiments, the third dielectric layer 380 may have a dielectric constant lower than 2.4. In various examples, the third dielectric layer 380 may be deposited by an ALD process, a CVD process, a subatmospheric CVD (SACVD) process, a flowable CVD process, a PVD process, or other suitable process. In some embodiments, the third dielectric layer 380 includes the same materials as the first dielectric layer 320 and the second dielectric layer 340.

Figure 19:
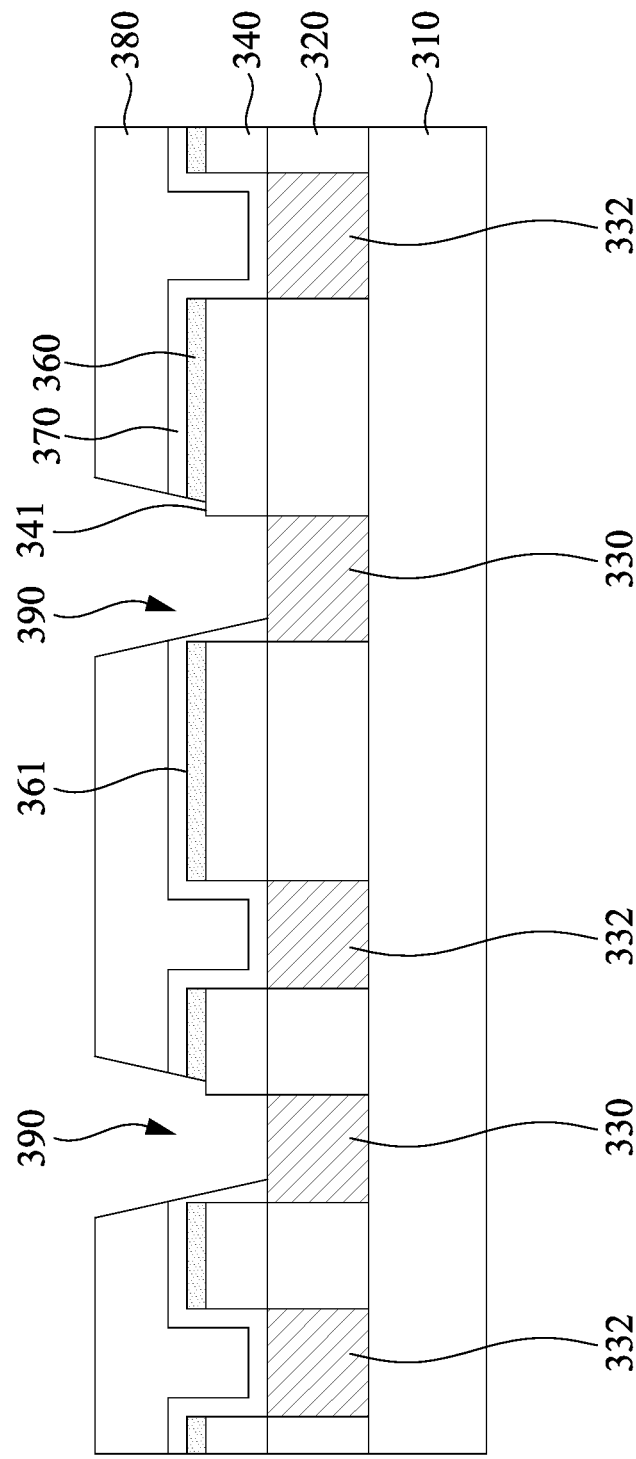

Reference is made to FIG. 19. After the third dielectric layer 380 is formed, an etching process is performed to form at least one opening 390 in the second dielectric layer 340, the second etch stop layer 370, and the third dielectric layer 380 such that the conductive features 330 are exposed through the opening 390. Further, a portion of a top surface 341 of the second dielectric layer 340 is exposed, and the other portions of the top surface 341 of the second dielectric layer 340 are covered by the first etch stop layer 360. In some embodiments, a patterned mask (not shown) is formed over the conductive features 332 prior to performing the etching process. The second etch stop layer 370 and the third dielectric layer 380 are etched using the patterned mask as an etch mask, such that the opening 390 is formed over the conductive features 330, while the second etch stop layer 370 and the third dielectric layer 380 remain unchanged over the conductive features 332.

In some embodiments, a left portion of the opening 390 has a different profile from a right portion of the opening 390. For example, the left portion of the opening 390 has a tapered sidewall separated from the first etch stop layer 360 by the second etch stop layer 370, while the right portion of the opening 390 has a tapered sidewall in contact with the first etch stop layer 360. The right portion of the opening 390 further has a bottommost top surface connect to the tapered sidewall, and the bottommost top surface is a portion of the second dielectric layer 340. In some other embodiments, performing the etching process to form the opening 390 may also etch the first etch stop layer 360, such that the left portion of the opening 390 has the same or similar profile as the right portion of the opening 390. Due to the etch selectivity between the first etch stop Layer 360 and the second dielectric layer 340, e.g., the second dielectric layer 340 has higher etch selectivity with respect to the first etch stop layer 360, the second dielectric layer 340 protrudes from the first etch stop layer 360 and thus a stepped sidewall of the opening 390 is formed. Further, the second dielectric layer 340 can slow down or even stop the etching process of forming the openings 390, which in turn prevents over-etching the dielectric materials (e.g., first dielectric layer 320) under the second dielectric layer 340 and results in reduced risk of leakage current.

In some embodiments, the etching process of forming the opening 390 may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3$: $NH_4F:H_2O$, and/or the like.

Figure 20:
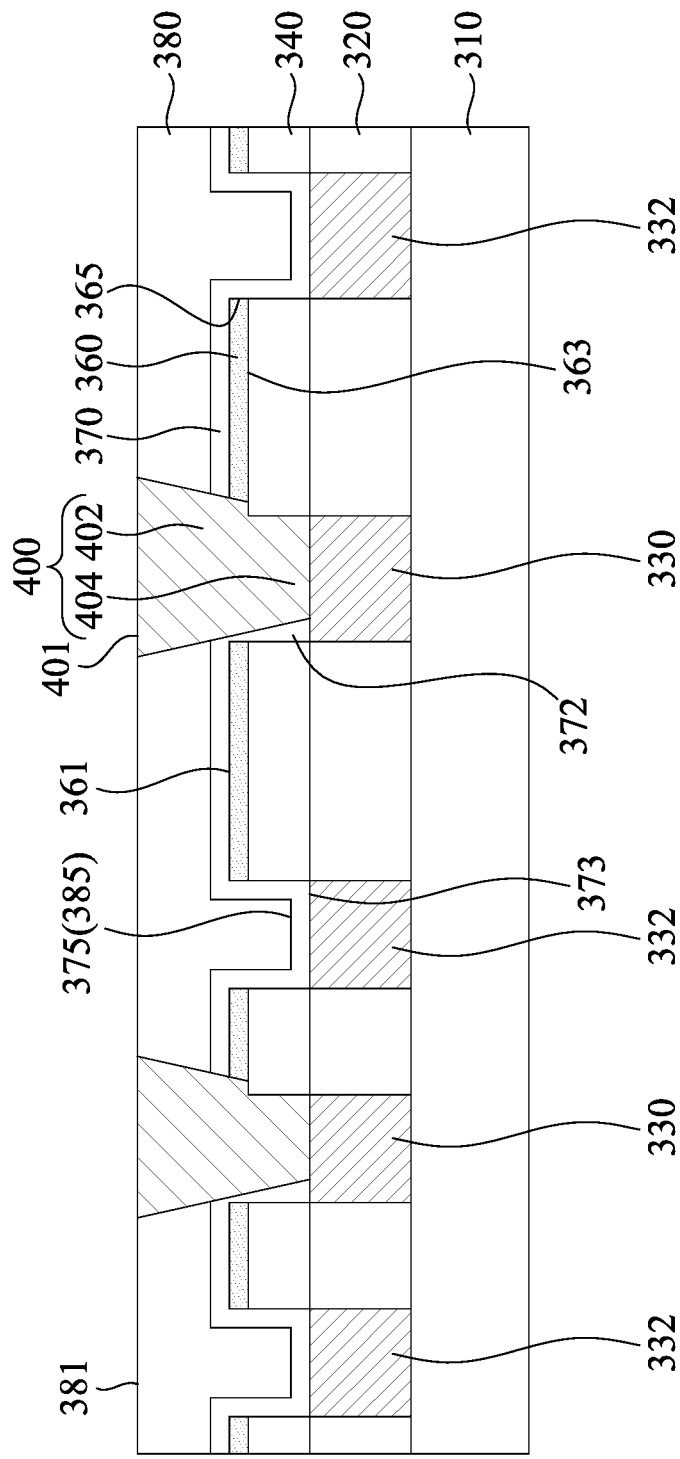

Reference is made to FIG. 19 and FIG. 20. Conductive materials are filled in the opening 390 to form conductive vias 400. The conductive vias 400 are electrically connected to the conductive features 330, respectively. In some embodiments, the conductive vias 400 includes metal, such as W, Co, Ru, Al, Cu, or other suitable materials. After the deposition of the conductive vias 400, a planarization process, such as a chemical mechanical planarization (CMP) process, may be then performed to remove excess conductive material outside the openings 390. In some embodiments, the conductive vias 400 extends upwards from the conductive features 330 and formed in the first etch stop layer 360, the second etch stop layer 370, and the third dielectric layer 380. The conductive via 400 has a top portion 402 and a bottom portion 404 in contact with the top portion 402, in which the top portion 402 is formed in the second etch stop layer 370 and the third dielectric layer 380, and the bottom portion 404 is formed adjacent to the second dielectric layer 340.

Due to configurations of multiple etch stop layers (e.g., the first etch stop layer 360 and the second etch stop layer 370), the conductive vias 400 can be formed aligned with the underlying conductive features 330, respectively. As such, contact area between the conductive vias 400 and the conductive features 330 can be increased and thus the overlay shift problem can be avoided, thereby improving the performance of the semiconductor structure. For example, time-dependent dielectric breakdown (TDDB) life can be increased.

In some embodiments, a minimum width the top portion 402 of the conductive vias 400 is greater than a width of the bottom portion 404 of the conductive vias 400. In some embodiments, an area of the top portion 402 of the conductive vias 400 is greater than an area of the bottom portion 404 of the conductive vias 400. In some embodiments, the top portion 402 of the conductive vias 400 tapers from the third dielectric layer 380 to the first etch stop layer 360.

In some embodiments, the semiconductor structure in FIG. 20 includes the first dielectric layer 320, the conductive features 330 and 332, the first etch stop layer 360, and the conductive vias 400. The first dielectric layer laterally surrounds the conductive features 330 and 332. The first etch stop layer 360 is disposed over the first dielectric layer 320. The conductive vias 400 are laterally surrounded by the first etch stop layer 360 and electrically connected to the conductive features 330.

In some embodiments, the conductive vias 400 are spaced apart from the conductive features 332. In some embodiments, the conductive vias 400 has the top portion 402 and the bottom portion 404 in contact with the top portion 402. The top portion 402 is wider than the bottom portion 404. The bottom portion 404 is in contact with the conductive features 330.

In some embodiments, the semiconductor structure further includes the second etch stop layer 370 over the first etch stop layer 360. The second etch stop layer 370 is in contact with the first etch stop layer 360 and the conductive vias 400. The second etch stop layer 370 is in contact with a sidewall 365 of the first etch stop layer 360 and has a material different from the first etch stop layer 360. In some embodiments, a bottom surface 373 of the second etch stop layer 370 is lower than a bottom surface 363 of the first etch stop layer 360. In some embodiments, the second etch stop layer 370 has a portion in contact of the conductive features 332. The portion of the second etch stop layer 370 has a top surface (i.e., bottommost top surface 375 of the second etch stop layer 370) lower than the bottom surface 363 of the first etch stop layer 360. In some embodiments, the second etch stop layer 370 has a portion 372 in contact of the conductive features 330 and the conductive vias 400. The portion 372 of the second etch stop layer 370 is between the second dielectric layer 340 and the bottom portion 404 of the conductive vias 400.

In some embodiments, the semiconductor structure further includes the second dielectric layer 340, and the third dielectric layer 380. The second dielectric layer 340 is disposed over the first dielectric layer 320 and in contact with the bottom portion 404 of the conductive vias 400. The third dielectric layer 380 surrounds the top portion 402 of the conductive vias 400. In some embodiments, a top surface 381 of the third dielectric layer 380 is substantially coplanar with a top surface 401 of the conductive vias 400. A bottommost surface 385 of the third dielectric layer 380 is lower than the top surface 361 of the first etch stop layer 360.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the configurations of multiple etch stop layers (e.g., the first etch stop layer, the capping layer, and the second etch stop layer in some cases) are beneficial for the conductive vias to be formed aligned with the underlying conductive features, respectively. As such, contact area between the conductive vias and the conductive features can be increased and thus the overlay shift problem can be avoided. On the other hand, since edge placement error (EPE) is caused by the overlay shift problem, the EPE reliability can be improved by using the configurations of above-mentioned semiconductor structure.

According to some embodiments, a semiconductor structure includes a first dielectric layer, a first conductive feature, a second conductive feature, first etch stop layer, and a conductive via. The first conductive feature and the second conductive feature are embedded in the first dielectric layer. The first etch stop layer is disposed over the dielectric layer. The conductive via is surrounded by the first etch stop layer and electrically connected to the first conductive feature, in which the conductive via is in contact with a top surface of the first etch stop layer.

According to some embodiments, a semiconductor structure includes a first conductive feature, a second conductive feature, a dielectric layer, a first etch stop layer, a second etch stop layer, and a conductive via. The dielectric layer laterally surrounds the first conductive feature and the second conductive feature. The first etch stop layer is disposed over the dielectric layer. The second etch stop layer is disposed over the second conductive feature, in contact with a sidewall of the first etch stop layer, and has a material different from the first etch stop layer. The conductive via is laterally surrounded by the first and second etch stop layers and electrically connected to the first conductive feature.

According to some embodiments, a method of forming a semiconductor structure includes forming a first conductive feature and a second conductive feature in a dielectric layer. A first etch stop layer is selectively formed over the dielectric layer while leaving the first conductive feature and the second conductive feature exposed. A second etch stop layer is formed over the first etch stop layer. The second etch stop layer is etched to form an opening. A conductive material is filled in the opening to form a conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first conductive feature and a second conductive feature in a dielectric layer;
   selectively forming a first etch stop layer over the dielectric layer while leaving the first conductive feature and the second conductive feature exposed;
   forming a capping layer over the first conductive feature;
   performing a plasma treatment on the capping layer to form a bonding layer between the capping layer and the first conductive feature;
   forming a second etch stop layer over the first etch stop layer;
   etching the second etch stop layer to form an opening; and
   filling a conductive material in the opening to form a conductive via.

2. The method of claim 1, wherein etching the second etch stop layer to form the opening is performed such that the first etch stop layer is exposed by the second etch stop layer.

3. The method of claim 1, wherein the conductive via has an upper sidewall slanted with respect to a top surface of the second etch stop layer and a lower sidewall vertical to the top surface of the second etch stop layer.

4. The method of claim 1, wherein the conductive via has opposite sidewalls symmetric in relation to the first conductive feature.

5. A method, comprising:
forming a first conductive feature and a second conductive feature embedded in a first dielectric layer;
forming a first etch stop layer over the first dielectric layer;
forming a capping layer over the second conductive feature and in contact with the first etch stop layer; and
forming a conductive via surrounded by the first etch stop layer and electrically connected to the first conductive feature, wherein the conductive via is in contact with a top surface of the first etch stop layer.

6. The method of claim 5, further comprising:
forming a bonding layer between the first conductive feature and the conductive via.

7. The method of claim 6, wherein a nitrogen concentration of the bonding layer is greater than the first conductive feature.

8. The method of claim 5, wherein the capping layer is spaced apart from the first conductive feature.

9. The method of claim 5, wherein the conductive via is spaced apart from the second conductive feature.

10. The method of claim 5, further comprising:
forming a second etch stop layer over the first etch stop layer, wherein the conductive via is surround by the second etch stop layer.

11. The method of claim 10, wherein an interface between the conductive via and the second etch stop layer is misaligned with an interface between the conductive via and the first etch stop layer.

12. The method of claim 5, wherein a top portion of the conductive via is wider than a bottom portion of the conductive via.

13. The method of claim 5, wherein the conductive via has a slanted sidewall terminating at the top surface of the first etch stop layer.

14. The method of claim 5, wherein the first conductive feature has a top surface wider than a bottom surface of the conductive via.

15. A method, comprising:
forming a conductive feature in a dielectric layer;
forming an inhibitor on the conductive feature;
forming a first etch stop layer over the dielectric layer, leaving a top surface of the inhibitor uncovered;
removing the inhibitor to expose the conductive feature;
after removing the inhibitor to expose the conductive feature, depositing a capping layer over the conductive feature and the first etch stop layer;
performing a planarization process to remove the capping layer over the first etch stop layer;
forming a second etch stop layer over the first etch stop layer and the conductive feature;
etching the second etch stop layer; and
forming a conductive via over the conductive feature.

16. The method of claim 15, wherein the capping layer comprises metal nitride.

17. The method of claim 15, wherein the capping layer and the first etch stop layer comprises the same metal.

18. The method of claim 15, further comprising:
performing a plasma treatment on the capping layer by utilizing a nitrogen-containing gas such that a bonding layer is formed between the conductive feature and the capping layer.

19. The method of claim 18, wherein the bonding layer includes nitrogen and metal.

20. The method of claim 18, wherein the bonding layer has a nitrogen concentration less than a nitrogen concentration of the capping layer.

* * * * *